United States Patent
Shiah et al.

(10) Patent No.: US 7,508,726 B2
(45) Date of Patent: Mar. 24, 2009

(54) SIGNAL SENSING CIRCUIT AND SEMICONDUCTOR MEMORY DEVICE USING THE SAME

(75) Inventors: Chun Shiah, Hsinchu (TW);
Chun-Peng Wu, Hsinchu (TW);
Cheng-Nan Chang, Hsinchu (TW)

(73) Assignee: Etron Technology Inc., Hsinchu (TW)

( * ) Notice: Subject to any disclaimer, the term of this patent is extended or adjusted under 35 U.S.C. 154(b) by 0 days.

(21) Appl. No.: 11/798,058

(22) Filed: May 10, 2007

(65) Prior Publication Data

US 2008/0279026 A1    Nov. 13, 2008

(51) Int. Cl.
*G11C 7/00* (2006.01)
(52) U.S. Cl. .................. 365/205; 365/203; 365/202; 365/230.08
(58) Field of Classification Search ........... 365/205, 365/203, 202, 230.08
See application file for complete search history.

(56) References Cited

U.S. PATENT DOCUMENTS

| | | | |
|---|---|---|---|
| 6,091,648 A * | 7/2000 | Furutani et al. | 365/189.11 |
| 6,347,058 B1 * | 2/2002 | Houghton et al. | 365/203 |
| 6,717,460 B2 * | 4/2004 | Yamauchi et al. | 327/544 |
| 6,845,051 B2 * | 1/2005 | Komura | 365/203 |
| 2007/0242543 A1 * | 10/2007 | Romanovskyy et al. | 365/208 |
| 2008/0094921 A1 * | 4/2008 | Iida | 365/189.09 |

* cited by examiner

*Primary Examiner*—Connie C Yoha
(74) *Attorney, Agent, or Firm*—Rosenberg, Klein & Lee

(57) ABSTRACT

A signal sensing circuit and a semiconductor memory device using the same are provided. The signal sensing circuit comprises a sense amplifier, a kick transistor, a first control transistor, a second control transistor, a pre-charge circuit, and a recovery circuit. The kick transistor is used to pull up the operation voltage of the sense amplifier to improve the small signal sensing speed of the sense amplifier. After the signal is sensed, the recovery circuit will pull down the operation voltage of the sense amplifier to the standard level. In the present invention, the small signal sensing speed is greatly improved and the operation voltage of sense amplifier is kept away from the saturated level.

19 Claims, 7 Drawing Sheets

US 7,508,726 B2

SIGNAL SENSING CIRCUIT AND SEMICONDUCTOR MEMORY DEVICE USING THE SAME

FIELD OF THE INVENTION

The present invention relates to a signal sensing circuit and a semiconductor memory device using the same, and more particularly to a signal sensing circuit with a recovery circuit and a semiconductor memory device using the same.

BACKGROUND OF THE INVENTION

In order to improve the data transfer rate of a memory system, such as a dynamic random access memory (DRAM) system, people raise the clock frequency of the system. For the same purpose, the operation voltage for the memory device is reduced, too. During the read cycle of the memory system, it takes more time for the sense amplifier to catch the small signal form the array of memory cells in low operation voltage. That is a problem for the performance improving of the memory system.

Referring to FIG. 1, there is shown a timing diagram of the operation voltage of the sense amplifier of the semiconductor memory device of the prior art. In order to overcome the drawbacks of the prior art, people use a kick circuit to pull up the operation voltage of the sense amplifier of the memory device, so as to shorten the time needed for the sense amplifier to catch the small signal from the semiconductor memory device.

According to the specification, a read cycle of the semiconductor memory device comprises a period of pre-charge 13, a period of active 15, and a period of voltage kick 17, and then the signal stored in the semiconductor memory device is caught by the sense amplifier, and a read cycle is completed.

As shown in the figure, the operation voltage 12 of sense amplifier raises to a higher level during each period of voltage kick 17. If there is a sequence of read cycles, the operation voltage 12 may raise from the standard level 11 to the saturated level 19, such as VDD. After that, the voltage kick is no more helpful for the small signal sensing.

Furthermore, it would become difficult for the sense amplifier to switch to the pre-charge mode at high operation voltage. And that will take more time for the semiconductor memory device to complete a read cycle.

SUMMARY OF THE INVENTION

It is the primary object of the present invention to provide a signal sensing circuit that keeps all the advantage of the period of voltage kick and keeps the operation voltage away from the saturated level.

It is the secondary object of the present invention to provide a signal sensing circuit with a recovery circuit. The recovery circuit will pull operation voltage of the sense amplifier down to the standard level after each period of voltage kick, thus the operation voltage will not raise to the saturated level.

It is another object of the present invention to provide a signal sensing circuit with a recovery circuit. The recovery circuit will pull the operation voltage of the sense amplifier down to the standard level after each period of voltage kick, thus it will be easy for the sense amplifier to switch to the pre-charge mode.

It is another object of the present invention to provide a signal sensing circuit with a recovery circuit. The small signal sensing speed is improved, because of the higher voltage kick of the operation voltage being applied.

It is another object of the present invention to provide a semiconductor memory device using the signal sensing circuit which improves the speed of small signal sensing and is easy to switch to the write mode.

It is another object of the present invention to provide a semiconductor memory device using the signal sensing circuit with a recovery circuit. The recovery circuit will pull the operation voltage of the sense amplifier down to the standard level after each period of voltage kick, thus the operation voltage of the sense amplifier will not raise to the saturated level.

It is another object of the present invention to provide a semiconductor memory device using the signal sensing circuit with a recovery circuit. The recovery circuit will pull the operation voltage of the sense amplifier down to the standard level after each period of voltage kick, thus it will be easy for the semiconductor memory device to switch to the write mode.

It is another object of the present invention to provide a semiconductor memory device using the signal sensing circuit with a recovery circuit. The small signal sensing speed is improved, because of the higher voltage kick of the operation voltage being applied.

To achieve the above mentioned and other objects, the present invention provides a signal sensing circuit, comprising: a sense amplifier having a first sense terminal, a second sense terminal, a first power terminal and a second power terminal; a kick transistor with the source connected to a first supply voltage and a capacitor, and the gate controlled by a kick signal; a first control transistor with the source connected to the drain of said kick transistor at a node defined as a regulated node, the drain connected to said first power terminal and the gate controlled by a first control signal; a second control transistor with the source connected to a second supply voltage, the drain connected to said second power terminal and the gate controlled by a second control signal; a pre-charge circuit connected between said first power terminal and said second power terminal for providing a pre-charge voltage; and a recovery circuit connected between said regulated node and said second supply voltage for regulating the voltage on said regulated node.

The present invention further provides a semiconductor memory device using a signal sensing circuit, comprising: an array of memory cells arranged in rows and columns; a plurality of bit lines, wherein each bit line is connected to memory cells in a column associated with the bit line; a plurality of word lines, wherein each word line is connected to memory cells in a row associated with the word line; a signal sensing circuit, comprising: a plurality of sense amplifiers, wherein each sense amplifier comprises a first sense terminal, a second sense terminal, a first power terminal and a second power terminal, and each sense amplifier is connected to a pair of bit lines associated with the sense amplifiers at said first sense terminal and said second sense terminal; a pre-charge circuit connected to said first power terminal and said second power terminal of each sense amplifier by a first power line and a second power line respectively for providing a pre-charge voltage; a kick transistor with the source connected to a first supply voltage and a capacitor, and the gate controlled by a kick signal; a first control transistor with the source connected to the drain of said kick transistor at a node defined as a regulated node, the drain connected to said first power line, and the gate controlled by a first control signal; a second control transistor with the source connected to a second supply voltage, the drain connected to said second power line, and the gate controlled by a second control signal; and a recovery circuit connected between said regulated node and said second supply voltage for regulating the voltage on said regulated node.

DETAILED DESCRIPTION OF THE INVENTION

Figure 1:
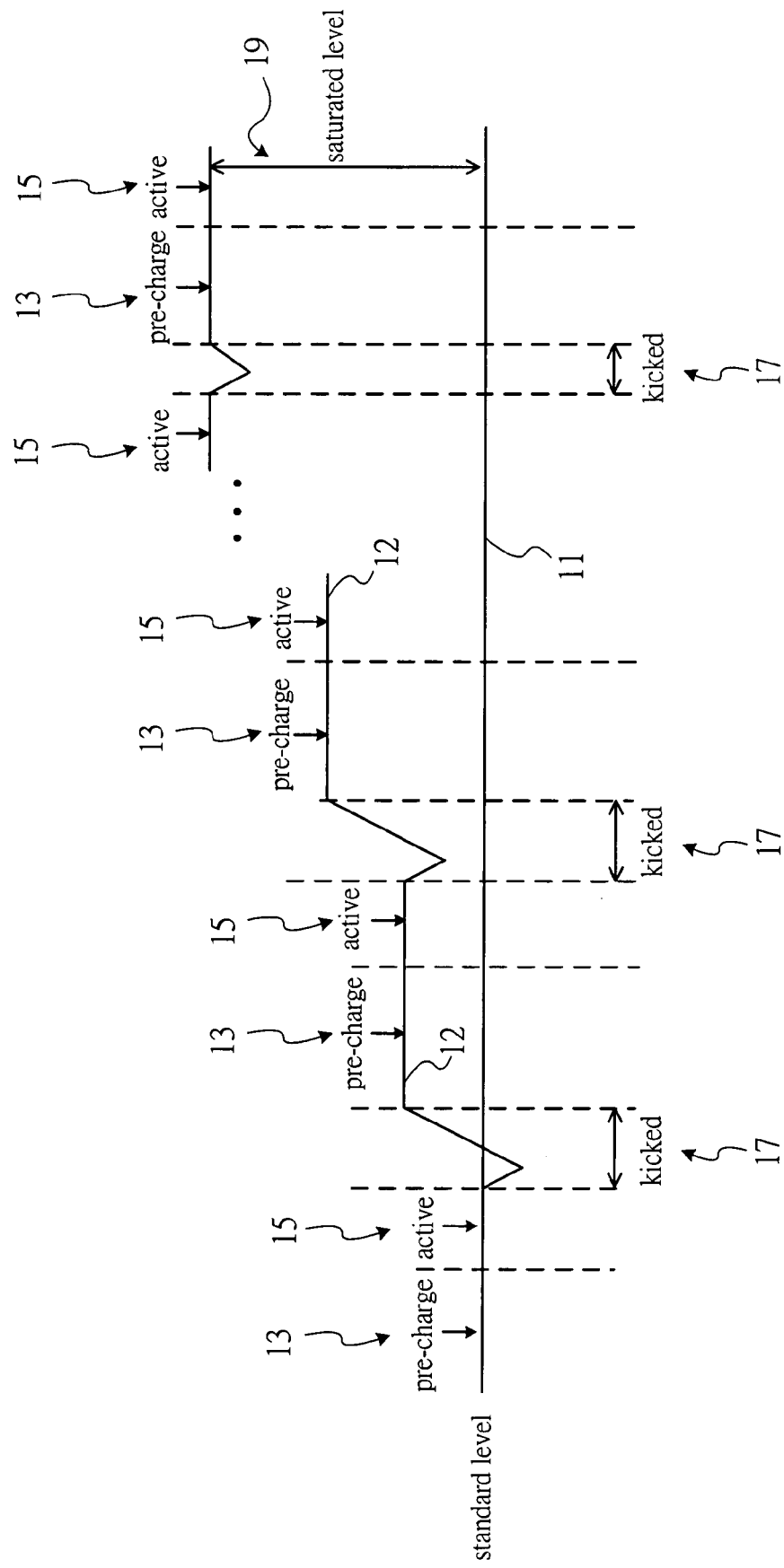
FIG. 1 shows a timing diagram of the operation voltage of the sense amplifier of the semiconductor memory device of the prior art.
Figure 2:
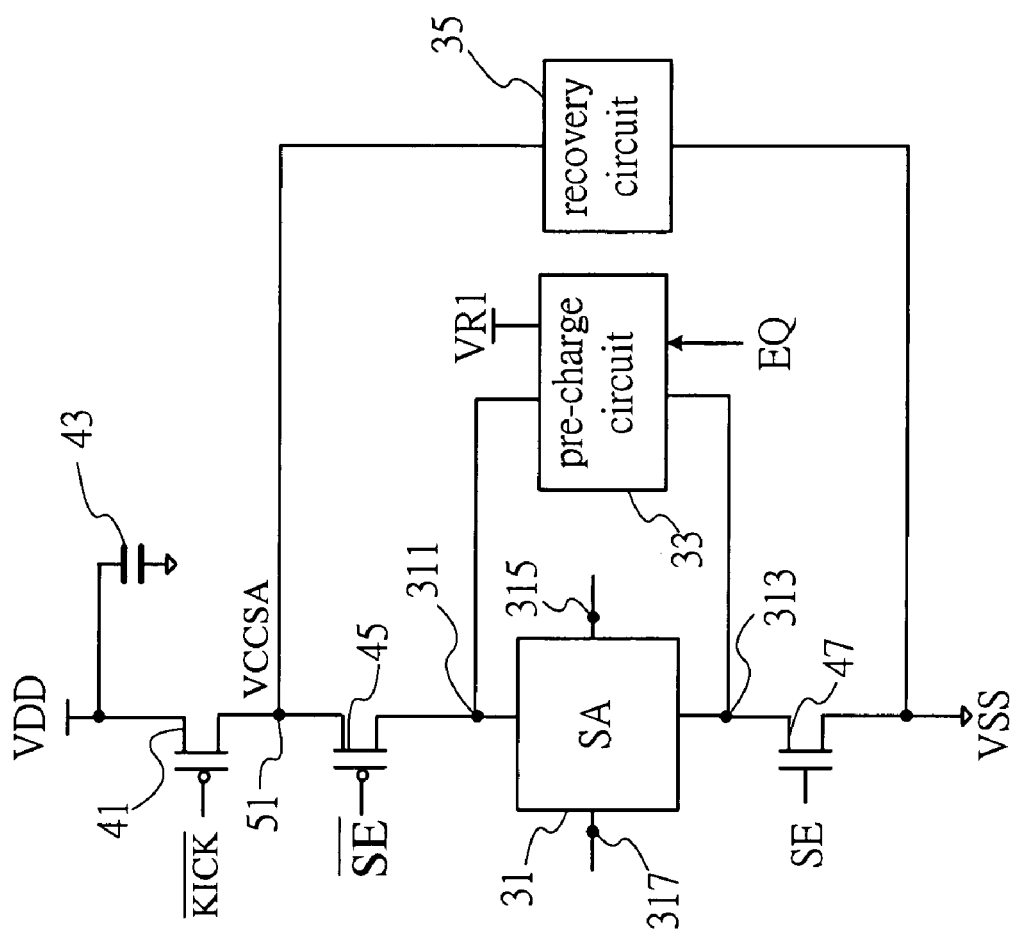
FIG. 2 shows a block diagram of a preferred embodiment of the signal sensing circuit of the present invention.
Figure 3:
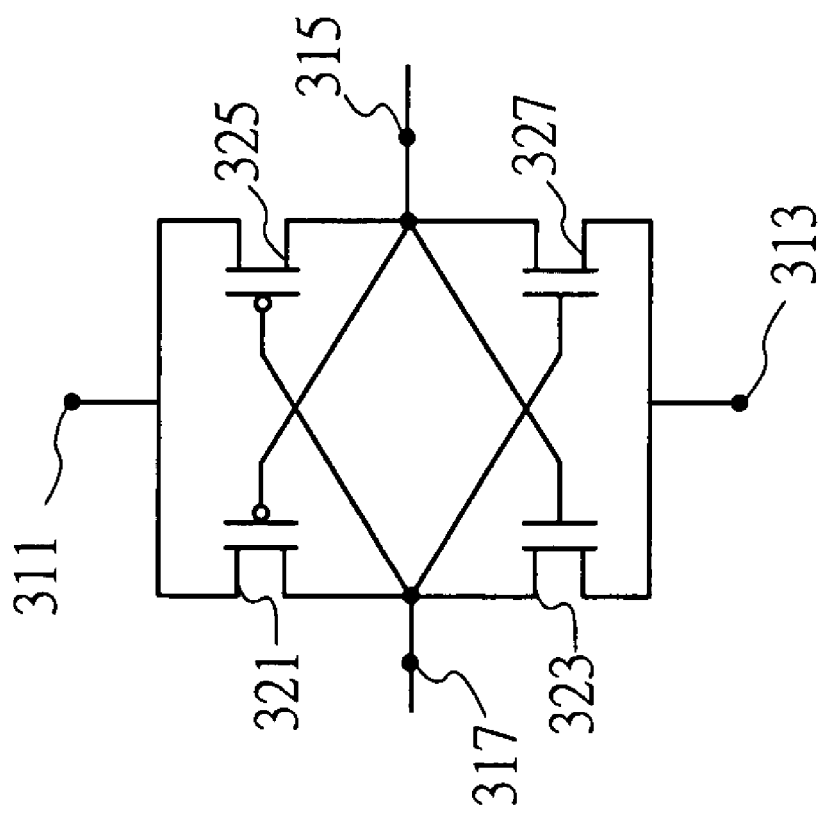
FIG. 3 shows a circuit diagram of a preferred embodiment of the sense amplifier of the present invention.
Figure 4:
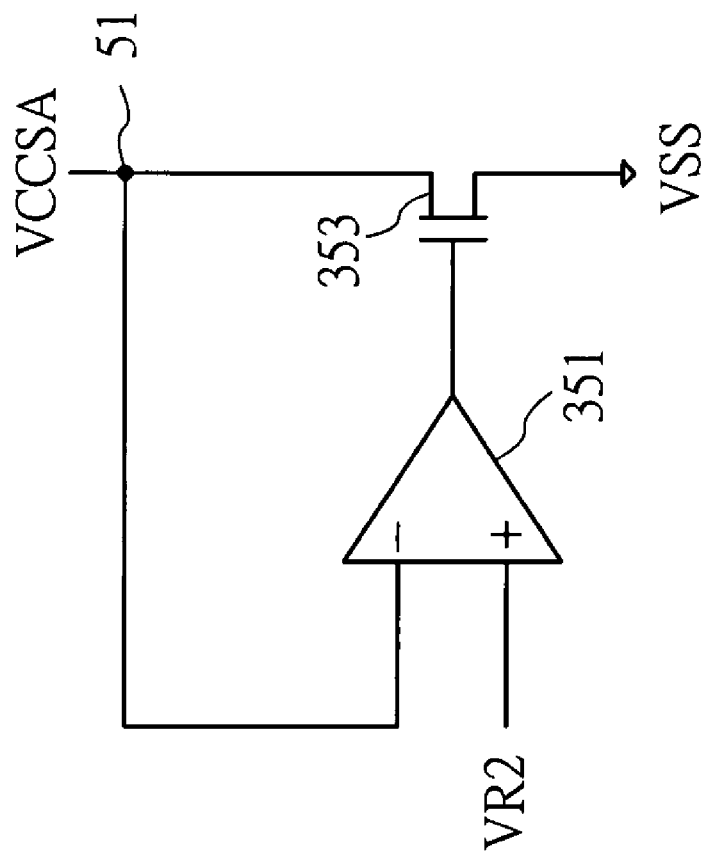
FIG. 4 shows a circuit diagram of a preferred embodiment of the recovery circuit of the present invention.

Referring to FIG. 2, FIG. 3, and FIG. 4, there are shown a block diagram of the sensing circuit, the circuit diagrams of the sense amplifier and the recovery circuit respectively of a preferred embodiment of the present invention. As shown in FIG. 2, the signal sensing circuit 30 comprises a sense amplifier 31, a kick transistor 41, a first control transistor 45, a second control transistor 47, a pre-charge circuit 33 and a recovery circuit 35.

The sense amplifier 31 comprises a first transistor 321, a second transistor 323, a third transistor 325 and a fourth transistor 327, as shown in FIG. 3. The first transistor 321 is a PMOS with the source connected to the source of the third transistor 325 at a node defined as the first power terminal 311, the drain connected to the drain of the second transistor 323 at a node defined as the second sense terminal 317. The second transistor 323 is a NMOS with the source connected to the source of the fourth transistor 327 at a node defined as the second power terminal 313, the drain connected to the drain of the first transistor 321 at a node defined as the second sense terminal 317. The third transistor 325 is a PMOS with the source connected to the first power terminal 311, the drain connected to the drain of the fourth transistor 327 at a node defined as the first sense terminal 315. The fourth transistor 327 is a NMOS with the source connected to the second power terminal 313, and the drain connected to the first sense terminal 315. The gates of the first transistor 321 and the second transistor 323 are connected to the first sense terminal 315. The gates of the third transistor 325 and the fourth transistor 327 are connected to the second sense terminal 317.

The first control transistor 45 is a PMOS with the drain connected to the first power terminal 311 of the sense amplifier 31, the source connected to the drain of the kick transistor 41 at a node defined as a regulated node 51, and the gate controlled by a first control signal $\overline{SE}$. The second control transistor 47 is a NMOS with the drain connected to the second power terminal 313 of the sense amplifier 31, the source connected to a second supply voltage VSS, and the gate controlled by a second control signal SE. The kick transistor 41 is a PMOS transistor with the source connected to a first supply voltage VDD and a capacitor 43, and the gate controlled by a kick signal $\overline{KICK}$.

The pre-charge circuit 33 is connected between the first power terminal 311 and the second power terminal 313 of the sense amplifier 31 for providing a pre-charge voltage to the signal stored device, such as the memory cell, through the sense amplifier 31. Moreover, the pre-charge circuit is connected to a first reference voltage VR1 which is about half of the first supply voltage (VDD/2) for providing the pre-charge voltage.

The recovery circuit 35 comprises a NMOS transistor 353 and an operational amplifier 351, as shown in FIG. 4. The NMOS transistor 353 has the drain connected to the regulated node 51, the source connected to the second supply voltage VSS. The operational amplifier 351 has the negative input connected to the regulated node 51, the positive input connected to a second reference voltage VR2, and the output connected to the gate of the NMOS transistor 353. The second reference voltage VR2 is a user defined voltage level, and it is preferred to be equal to the standard level of the operation voltage of the sense amplifier 31.

When the voltage of the regulated node 51 is higher than the second reference voltage VR2, the operational amplifier 351 outputs a high level signal to the gate of the NMOS transistor 353, and turns on the NMOS transistor 353. When the voltage of the regulated node 51 is lower than the second reference voltage VR2, the operational amplifier 351 outputs a low level signal to the gate of the NMOS transistor 353, and turns off the NMOS transistor 353.

At the period of pre-charge, the first control transistor 45 and the second control transistor 47 are turned off by the first control signal $\overline{SE}$ and the second control signal SE respectively. The pre-charge circuit 33 is enabled by a start signal EQ for providing a pre-charge voltage to the signal stored device through the sense amplifier 31. During the period, the sense amplifier 31 is in the pre-charge mode.

When the period of pre-charge is completed, the pre-charge circuit 35 will be turned off, and the first control transistor 45 and the second control transistor 47 will be turned on by the first control signal $\overline{SE}$ and the second control signal SE respectively. Then the sense amplifier 31 is turned to the signal sensing mode.

When the voltage difference between the first sense terminal 315 and the second sense terminal 317 is greater than 100 mV, the kick transistor 41 will be driven by the kick signal $\overline{KICK}$ and be turned on for a short period of time. The voltage of the regulated node 51, named as regulated voltage VCCSA, is kicked up higher than the standard level during the period of voltage kick, and the higher operating voltage improves the small signal sensing speed of the sense amplifier 31.

When the regulated voltage VCCSA is greater than the second reference voltage VR2, such as the standard operation voltage of the sense amplifier 31, the NMOS transistor 353 is turned on, that the regulated voltage VCCSA will be pulled down after the kick transistor 41 is turned off.

And then, if the regulated voltage VCCSA is pulled down to the second reference voltage VR2, the NMOS transistor 353 will be turned off, and the regulated voltage VCCSA will keep equal to the second reference voltage VR2.

Figure 5:
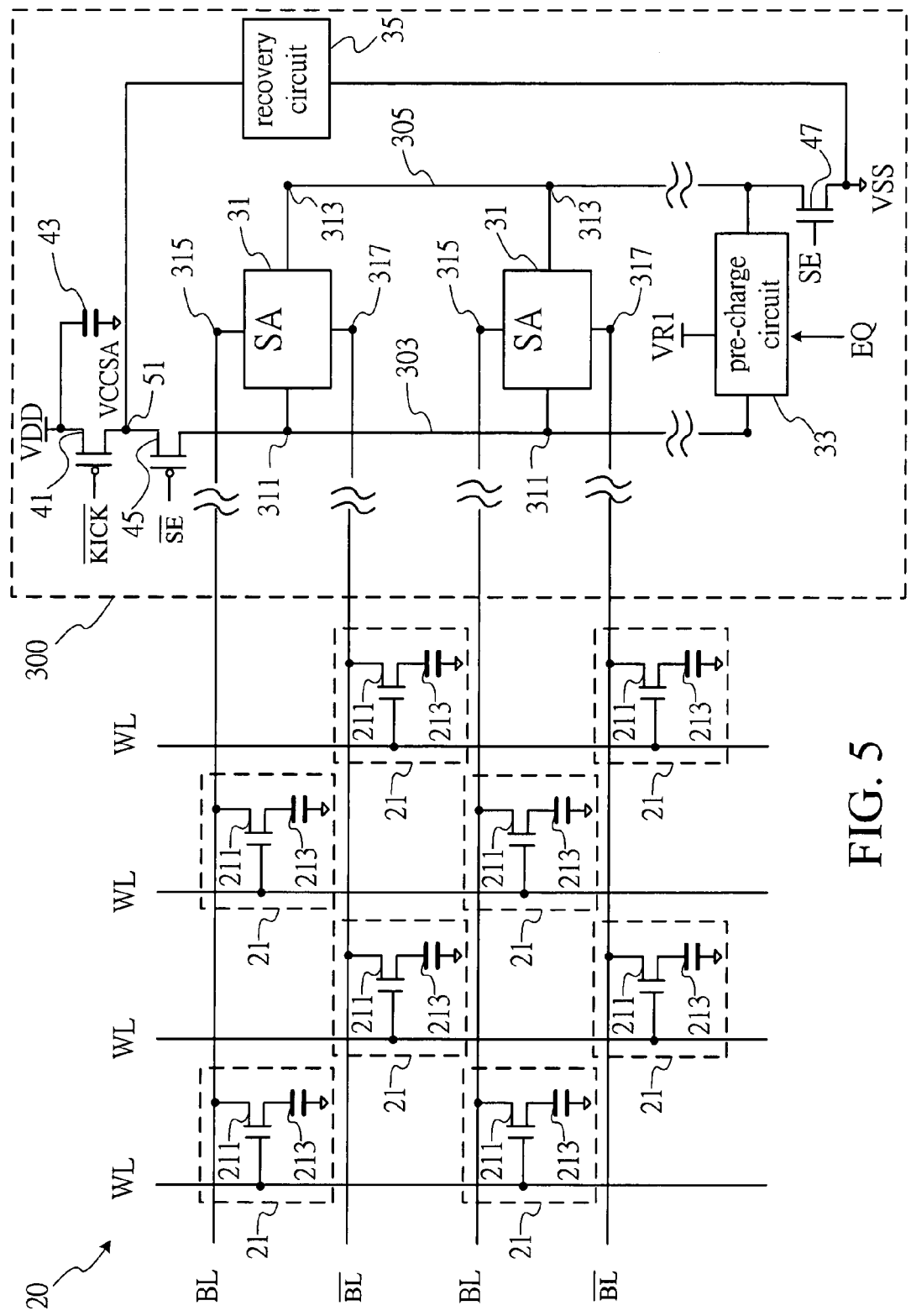
FIG. 5 shows a circuit diagram of a preferred embodiment of the semiconductor memory device of the present invention.
Figure 6:
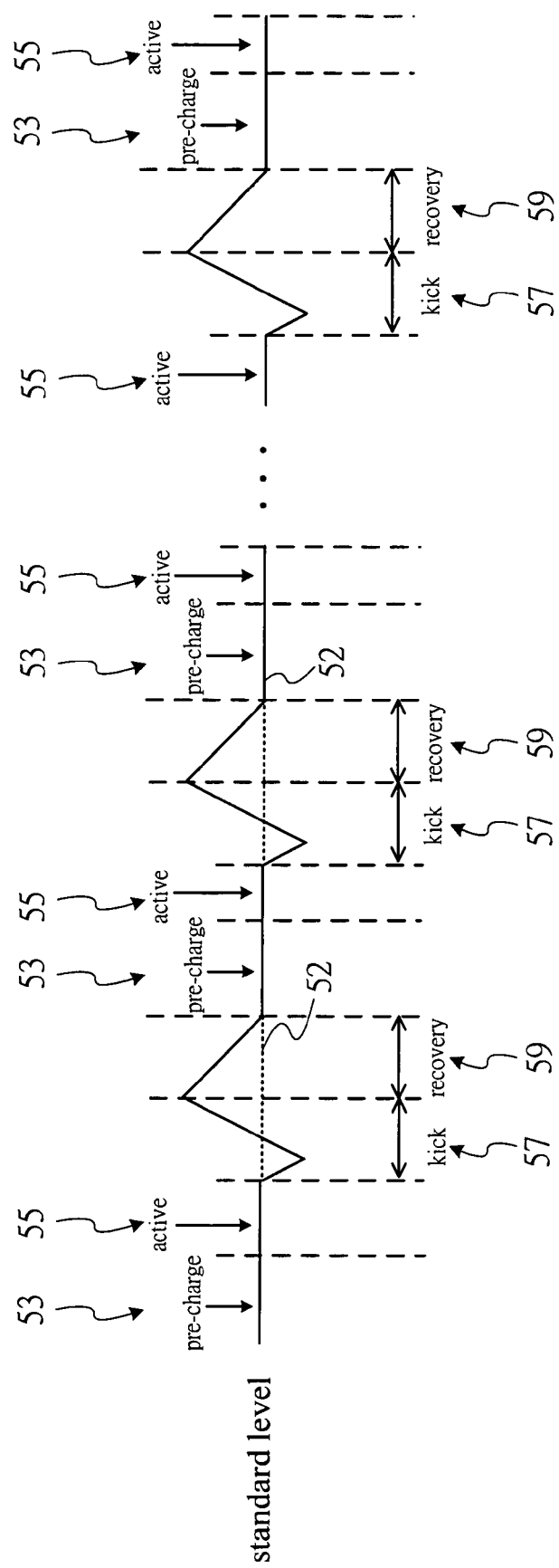
FIG. 6 shows a timing diagram of the operation voltage of the sense amplifier of the present invention.

Referring to FIG. 5 and FIG. 6, there are shown a circuit diagram of a preferred embodiment of the semiconductor memory device and a timing diagram of the operation voltage of the sense amplifier of the present invention. The semiconductor memory device comprises an array 20 of memory cells 21, a plurality of bit lines BL, $\overline{BL}$, a plurality of word lines WL and a signal sensing circuit 300.

The memory cells 21 are arranged in rows and columns in the array 20. Each memory cell 21 comprises a transistor 211 and a memory capacitor 213. Each transistor 211 has the drain connected to the corresponding bit line (BL or $\overline{BL}$), the gate connected to the corresponding word line WL and the source connected to one end of the memory capacitor 213. The other end of the memory capacitor 213 is connected to the ground voltage (or VSS).

The signal sensing circuit 300 comprises a plurality of sense amplifier 31, a kick transistor 41, a first control transistor 45, a second control transistor 47, a pre-charge circuit 33 and a recovery circuit 35. As shown in FIG. 5, the structure of the signal sensing circuit 300 is almost the same as the signal sensing circuit 30 shown in FIG. 2, but there are numbers of sense amplifiers 31 in the signal sensing circuit 300 of the present embodiment. Each sense amplifier 31 has the first sense terminal 315 and the second sense terminal 317 connected to the corresponding bit lines BL and $\overline{BL}$ respectively, the first power terminal 311 connected to the drain of the first control transistor 45 by the first power line 53, and the second power terminal 313 connected to the drain of the second control transistor 47 by the second power line 305. The pre-charge circuit 33 is connected between the first power line 303 and the second power line 305.

When the semiconductor memory device starts a read cycle, it starts a period of pre-charge 53 first. During the period of pre-charge 53, the first control transistor 45 and the second control transistor 47 are turned off, and the pre-charge circuit 33 is enabled for providing a pre-charge voltage, such as VR1, to the bit lines BL and $\overline{BL}$.

After pre-charge completed, the pre-charge circuit 33 is disabled, and the semiconductor memory device starts a period of active 55. During the period of active 55, one of the word lines WL is selected to provide a high level signal, and the transistors 211 in the memory cells 21 which are connected to the selected word line WL will be turned on, and the signals stored in the memory capacitors 213, such as a high level voltage or a low level voltage, will pass through the transistors 211 to the corresponding bit lines BL or $\overline{BL}$.

At the beginning of the period of active 55, the signals on the bit lines BL and $\overline{BL}$ are too small to be sensed. When the voltage difference between BL and $\overline{BL}$ is greater than 100 mV, the kick transistor 41 is turned on by the kick signal KICK, and the semiconductor memory device goes into the period of voltage kick 57.

As the kick transistor 41 is turned on, the second control transistor 47 is turned on also, and then the first control transistor 45 will be turned on in sequence. In this way, the voltage difference between $\overline{BL}$ and the pre-charge voltage is quickly amplified to the order of 300 mV for signal sensing during the period of voltage kick 57.

After the signals were sensed, kick transistor 41 is turned off, and the regulated voltage VCCSA is pulled down to the second reference voltage VR2 (standard level) during the period of recovery 59. This helps the improvement of small signal sensing speed and prevents the operation voltage of the sense amplifier from saturated level.

Figure 7:
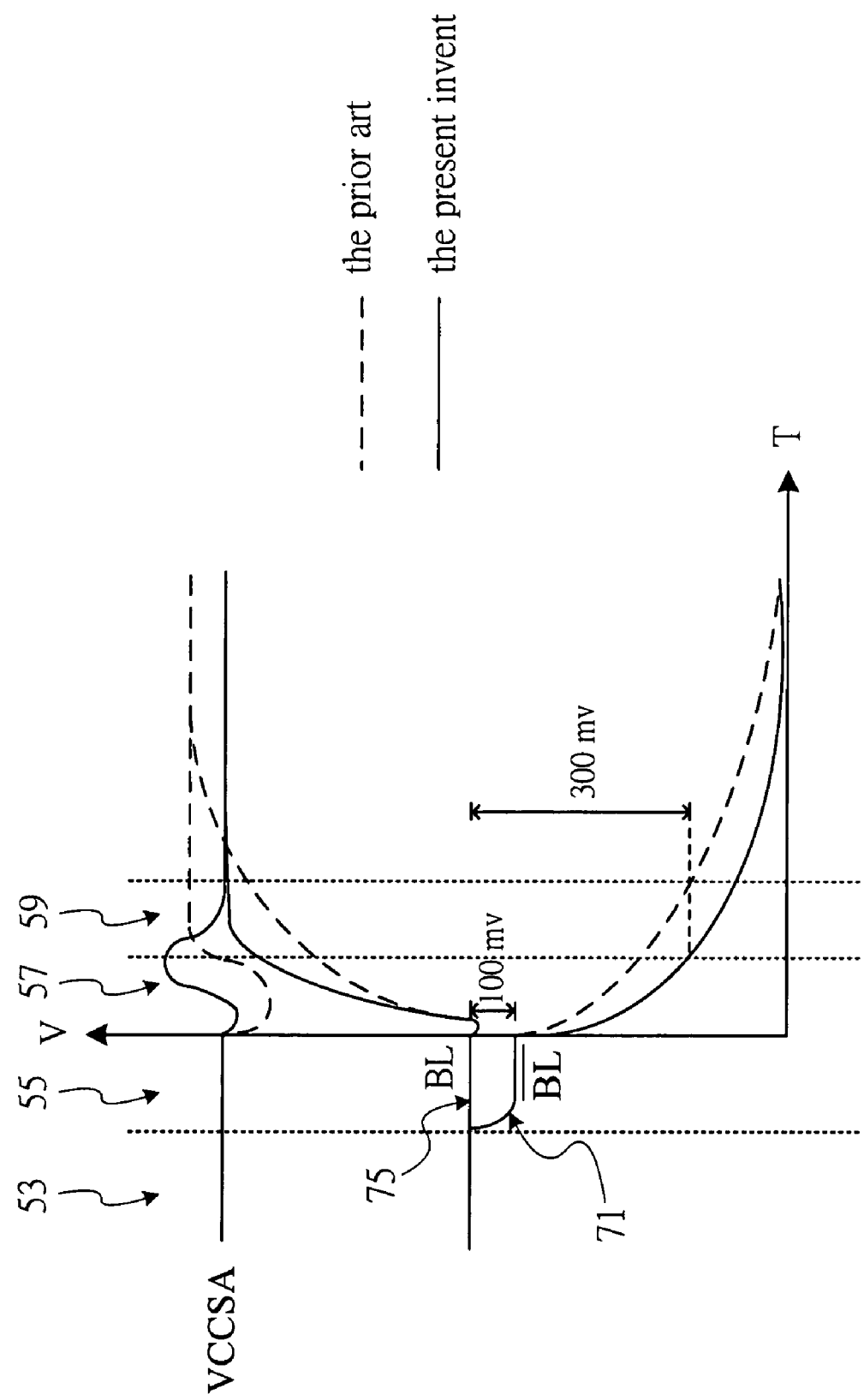
FIG. 7 shows a timing diagram of the small signal sensing of preferred embodiment of the present invention.

Referring to FIG. 7, there is shown a timing diagram of the small signal sensing of preferred embodiment of the present invention.

Assume that the signal stored in a selected memory cell 21 is a low level voltage, and the memory cell 21 is connected to the BL and $\overline{BL}$ of the associated pair of bit lines. As shown in the figure, when the semiconductor memory device is in the period of pre-charge 53, the regulated voltage VCCSA is in the standard level 52, and the voltage of the BL and $\overline{BL}$ 75, 71 are equal to the pre-charge voltage. During the period of active 55, the voltage of the $\overline{BL}$ 71 is pulled down slightly by the selected memory cell, the voltage of the BL 75 is equal to the pre-charge voltage, and the regulated voltage VCCSA keeps in the standard level 52.

When the voltage difference between the BL and $\overline{BL}$ is greater than 100 mV, the semiconductor memory device goes into the period of voltage kick 57, the kick transistor 41 and the second control transistor 47 are turned on simultaneously, and then the first control transistor 45 is turned on sequentially. The regulated voltage VCCSA is pulled up by the kick transistor 41, the voltage of the $\overline{BL}$ 71 is quickly pulled down, and then the voltage of the BL 75 will be quickly pulled up after the first control transistor 45 is turned on.

When the voltage difference between the $\overline{BL}$ and the pre-charge voltage is greater than 300 mV, the signal is amplified to the order that is ready for signal sensing. Then the kick transistor 41 is turned off, and the regulated voltage VCCSA will be pulled down to the standard level 52 by the recovery circuit 35 during the period of recovery 59.

The performance of the present invention is characterized by the solid line, and the performance of the prior art is characterized by the dotted line in the figure.

It is obvious that the small signal sensing speed is greatly improved in the present invention. Because of the using of the recovery circuit, the operation voltage of the sense amplifier, i.e. the regulated voltage VCCSA, can be kicked as high as possible to improve the performance of the sense amplifier. So that the small signal can be amplified much quickly than it is in the prior art. Moreover, the regulated voltage VCCSA will be pulled down to the standard level after the signal is sensed in the present invention, and this prevents the regulated voltage VCCSA from the saturated level.

While this invention has been particularly shown and described with reference to the preferred embodiments thereof, it will be understood by those skilled in the art that various changes in form and details may be made without departing from the spirit and scope of the invention.

What is claimed is:

1. A signal sensing circuit, comprising:
   a sense amplifier having a first sense terminal, a second sense terminal, a first power terminal and a second power terminal;
   a kick transistor with the source connected to a first supply voltage and a capacitor, and the gate controlled by a kick signal;
   a first control transistor with the source connected to the drain of said kick transistor at a node defined as a regulated node, the drain connected to said first power terminal and the gate controlled by a first control signal;
   a second control transistor with the source connected to a second supply voltage, the drain connected to said second power terminal and the gate controlled by a second control signal;
   a pre-charge circuit connected between said first power terminal and said second power terminal for providing a pre-charge voltage; and
   a recovery circuit connected between said regulated node and said second supply voltage for regulating the voltage on said regulated node; said voltage of said regulated node responsive to a voltage difference between said first and second sense terminals; said voltage of said regulated node operatively lowered to a second reference voltage of the recovery circuit when greater than the second reference voltage of said recovery circuit and said kick transistor is turned off.

2. The signal sensing circuit of claim 1, wherein said pre-charge circuit is further connected to a first reference voltage.

3. The signal sensing circuit of claim 2, wherein said pre-charge circuit provides said pre-charge voltage in response to a start signal.

4. The signal sensing circuit of claim 1, wherein said first control signal and said second control signal are complementary signals.

5. The signal sensing circuit of claim 1, wherein said sense amplifier comprises:
   a first transistor with the source connected to said first power terminal, the drain connected to said second sense terminal and the gate connected to said first sense terminal;
   a second transistor with the source connected to said second power terminal, the drain connected to said second sense terminal and the gate connected to said first sense terminal;
   a third transistor with the source connected to said first power terminal, the drain connected to said first sense terminal and the gate connected to said second sense terminal; and
   a fourth transistor with the source connected to said second power terminal, the drain connected to said first power terminal and the gate connected to said second sense terminal.

6. The signal sensing circuit of claim 1, wherein said kick transistor is a PMOS transistor.

7. The signal sensing circuit of claim 1, wherein said first control transistor is a PMOS transistor.

8. The signal sensing circuit of claim 1, wherein said second control transistor is a NMOS transistor.

9. The signal sensing circuit of claim 1, wherein said recovery circuit comprises:
   a NMOS transistor with the drain connected to said regulated node, the source connected to said second supply voltage; and
   an operational amplifier with the output connected to the gate of said NMOS transistor, the negative input connected to said regulated node, and the positive input connected to a second reference voltage; said recovery circuit connected indirectly to the pre-charge circuit through the first and second control transistors.

10. A semiconductor memory device using a signal sensing circuit, comprising:
    an array of memory cells arranged in rows and columns;
    a plurality of bit lines, wherein each bit line is connected to memory cells in a column associated with the bit line;
    a plurality of word lines, wherein each word line is connected to memory cells in a row associated with the word line;
    a signal sensing circuit, comprising:
    a plurality of sense amplifiers, wherein each sense amplifier comprises a first sense terminal, a second sense terminal, a first power terminal and a second power terminal, and each sense amplifier is connected to a pair of complementary bit lines associated with the sense amplifiers at said first sense terminal and said second sense terminal, wherein one of the pair connected to the first sense terminal is the complement of the other connected to the second sense terminal;
    a pre-charge circuit connected to said first power terminal and said second power terminal of each sense amplifier by a first power line and a second power line respectively for providing a pre-charge voltage;
    a kick transistor with the source connected to a first supply voltage and a capacitor, and the gate controlled by a kick signal;
    a first control transistor with the source connected to the drain of said kick transistor at a node defined as a regulated node, the drain connected to said first power line, and the gate controlled by a first control signal;
    a second control transistor with the source connected to a second supply voltage, the drain connected to said second power line, and the gate controlled by a second control signal; and
    a recovery circuit connected between said regulated node and said second supply voltage for regulating the voltage on said regulated node; said voltage of said regulated node responsive to a voltage difference between said pre-charge voltage and said complementary bit line; said voltage of said regulated node operatively lowered to a standard level voltage when the voltage difference between said pre-charge voltage and said complementary bit line is greater than 300 mV and after said kick transistor is turned off.

11. The semiconductor memory device of claim 10, wherein said pre-charge circuit is further connected to a first reference voltage.

12. The semiconductor memory device of claim 11, wherein said pre-charge circuit provides said pre-charge voltage in response to a start signal.

13. The semiconductor memory device of claim 10, wherein said first control signal and said second control signal are complementary signals.

14. The semiconductor memory device of claim 10, wherein each pair of bit lines comprises a first bit line and a second bit line.

15. The semiconductor memory device of claim 10, wherein each sense amplifier comprises:
    a first transistor with the source connected to said first power terminal, the drain connected to said second sense terminal and the gate connected to said first sense terminal;
    a second transistor with the source connected to said second power terminal, the drain connected to said second sense terminal and the gate connected to said first sense terminal;
    a third transistor with the source connected to said first power terminal, the drain connected to said first sense terminal and the gate connected to said second sense terminal; and
    a fourth transistor with the source connected to said second power terminal, the drain connected to said first sense terminal and the gate connected to said second sense terminal.

16. The semiconductor memory device of claim 10, wherein said kick transistor is a PMOS transistor.

17. The semiconductor memory device of claim 10, wherein said first control transistor is a PMOS transistor.

18. The semiconductor memory device of claim 10, wherein said second control transistor is a NMOS transistor.

19. The semiconductor memory device of claim 10, wherein said recovery circuit comprises:
    a NMOS transistor with the drain connected to said regulated node, the source connected to said second supply voltage; and
    an operational amplifier with the output connected to the gate of said NMOS transistor, the negative input connected to said regulated node, and the positive input connected to a second reference voltage; said recovery circuit connected indirectly to the pre-charge circuit through the first and second control transistors.

* * * * *